(12) United States Patent
Chang et al.

(10) Patent No.: US 11,703,650 B2
(45) Date of Patent: Jul. 18, 2023

(54) OPTICAL FIBER PROTECTION SYSTEM

(71) Applicant: DELTA ELECTRONICS, INC., Taoyuan (TW)

(72) Inventors: Meng-Sheng Chang, Taoyuan (TW); Chien-Fu Tseng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 60 days.

(21) Appl. No.: 17/335,025

(22) Filed: May 31, 2021

(65) Prior Publication Data

US 2022/0163743 A1 May 26, 2022

(30) Foreign Application Priority Data

Nov. 24, 2020 (CN) .......................... 202011327855.7

(51) Int. Cl.
*H05B 47/105* (2020.01)
*G02B 6/44* (2006.01)
*G01R 31/327* (2006.01)

(52) U.S. Cl.
CPC ......... *G02B 6/4429* (2013.01); *G01R 31/327* (2013.01); *H05B 47/105* (2020.01)

(58) Field of Classification Search
CPC .. H05B 47/10; H05B 47/105; A61B 1/00096; A61B 1/00097; A61B 1/00167; A61B 1/05; A61B 1/0607; A61B 1/07; A61B 1/0017; G02B 23/2469; G02B 6/10; G02B 6/0008; G02B 6/3604; G02B 6/4298; G02B 6/4413; G02B 6/4429; G02B 6/4486; G02B 6/443; G92B 6/4436; C03B 37/032; C03B 37/05; C03B 37/07; C03B 2205/55
See application file for complete search history.

(56) References Cited

U.S. PATENT DOCUMENTS

| | | | | |
|---|---|---|---|---|
| 4,540,601 A | * | 9/1985 | Nath | C03C 25/1061 385/128 |
| 5,712,934 A | * | 1/1998 | Johnson | G01N 21/474 385/12 |
| 6,928,202 B2 | | 8/2005 | Pickrell et al. | |
| 2004/0223679 A1 | | 11/2004 | Pickrell et al. | |
| 2009/0296018 A1 | | 12/2009 | Harle et al. | |
| 2013/0163929 A1 | * | 6/2013 | Huang | G02B 6/3895 385/56 |
| 2014/0135576 A1 | * | 5/2014 | Hebert | A61B 1/012 600/109 |
| 2014/0221749 A1 | * | 8/2014 | Grant | A61B 1/00165 600/109 |
| 2018/0084981 A1 | * | 3/2018 | Wang | A61B 1/00096 |
| 2019/0223706 A1 | * | 7/2019 | Takeuchi | A61B 1/00167 |
| 2021/0387894 A1 | * | 12/2021 | Kladias | C03B 37/032 |

FOREIGN PATENT DOCUMENTS

| | | |
|---|---|---|
| CN | 2769904 Y | 4/2006 |
| CN | 105116483 A | 12/2015 |
| CN | 105223643 A | 1/2016 |
| TW | 335166 U | 6/1998 |

* cited by examiner

*Primary Examiner* — Haissa Philogene
(74) *Attorney, Agent, or Firm* — CKC & Partners Co., LLC

(57) ABSTRACT

An optical fiber protection system includes an optical fiber, a light source, a protection circuit, a sensor, and a controller. The light source is configured to transmit a signal to the optical fiber. The protection circuit extends along a length direction of the optical fiber. The sensor is electrically connected to the protection circuit. The controller is electrically connected to the sensor and the light source.

9 Claims, 3 Drawing Sheets

OPTICAL FIBER PROTECTION SYSTEM

CROSS-REFERENCE TO RELATED APPLICATION

This application claims priority to Chinese Application Serial Number 202011327855.7, filed Nov. 24, 2020, which is herein incorporated by reference in its entirety.

BACKGROUND

Field of Invention

The present invention relates to an optical fiber protection system.

Description of Related Art

Application requirement of the optical fiber in the projection system are increased gradually. The light transmission property and the flexible property of the optical fiber make the projection system be more flexible. The projection system includes an imaging system and a light source system that are isolated with each other, and the optical fiber may connected with the imaging system and the light source system that are isolated with each other so as to transmit the light. However, the light transmission efficiency of the optical fiber may degrade due to improper usage, such that the temperature of the optical fiber is increased. Therefore, the inner part of the melted optical fiber may be broken due to high temperature or the outer shell of the melted optical fiber may be penetrated such that the light may transmit out of the optical fiber and damage may occur.

Accordingly, it is still a development direction for the industry to provide an optical fiber protection system that may avoid malfunction.

SUMMARY

One aspect of the present disclosure is an optical fiber protection system.

In some embodiments, the optical fiber protection system includes an optical fiber, a light source, a protection circuit, a sensor, and a controller. The light source is configured to transmit a signal to the optical fiber. The protection circuit extends along a length direction of the optical fiber. The sensor is electrically connected to the protection circuit. The controller is electrically connected to the sensor and the light source.

In some embodiments, the protection circuit twines around the optical fiber.

In some embodiments, a material of the protection circuit includes a low-temperature solder.

In some embodiments, the optical fiber protection system includes a heat shrink tubing surrounds the low-temperature solder and the optical fiber, and the low-temperature solder is located between the heat shrink tubing and the optical fiber.

In some embodiments, a shrink temperature of the heat shrink tubing is higher than a melting temperature of the low-temperature solder.

In some embodiments, a length of the heat shrink tubing is smaller than a length of the optical fiber, and two sides of the optical fiber protrudes from the heat shrink tubing.

In some embodiments, a portion of the protection circuit is exposed form the heat shrink tubing.

In some embodiments, the sensor is configured to sense an electrical resistance of the protection circuit.

In some embodiments, the sensor is configured to determine whether the protection circuit is an open circuit.

In some embodiments, the controller is configured to control the light source based on a sensing result of the sensor.

In the aforementioned embodiments, when the optical fiber is partially overheated, the property of the low-temperature solder of the protection circuit may be utilized to form an open circuit of the optical fiber protection system of the present disclosure, and the sensor may sense that whether the protection circuit is an open circuit. Subsequently, the controller may transmit the signal to the light source so as to shut down the power to protect the optical fiber. Or, the heat shrink tubing may shrink to push the melted low-temperature solder due to high temperature such that the protection circuit may form the open circuit and the insulating property at the melting position may be increased to improve the precision of the optical fiber protection system.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
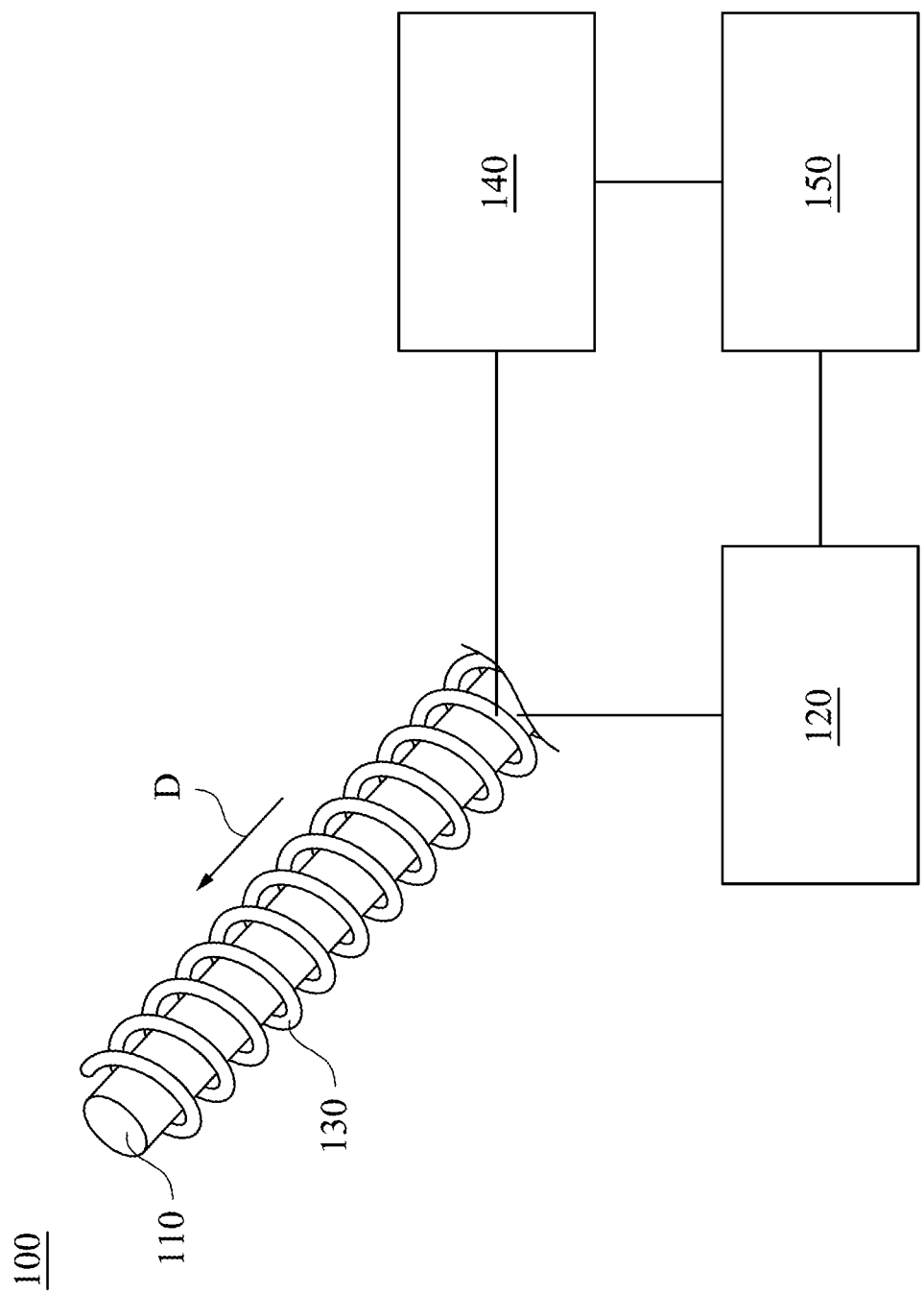
FIG. 1 is a schematic of an optical fiber protection system of an embodiment of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic of an optical fiber protection system 100 of an embodiment of the present disclosure. The optical fiber protection system 100 includes an optical fiber 110, a light source 120, a protection circuit 130, a sensor 140, and a controller 150. The light source 120 is configured to transmit a signal to the optical fiber 110. The protection circuit 130 extends along a length direction D1 of the optical fiber 110. The sensor 140 is electrically connected to the protection circuit 130. The controller 150 is electrically connected to the sensor 140 and the light source 120.

A material of the protection circuit 130 includes a low-temperature solder. In some embodiment, the materials of the low-temperature solder include an alloy of Bi, Pb, and Sn, and a melting temperature of the low-temperature solder is in a range of about 90 degrees to 100 degrees, but the present disclosure is not limited in this regard. Person having ordinary skill in the art may choose materials with specific melting points. The sensor 140 is configured to determine whether the protection circuit 130 is an open circuit. The controller 150 is configured to control the light source 120 based on a sensing result of the sensor 140. As such, when the optical fiber 110 is partially overheated, the property of the low-temperature solder of the protection circuit 130 may form an open circuit, and the sensor 140 may sense that whether the protection circuit 130 is an open circuit. Subsequently, the controller 150 may transmit the signal to the light source 120 so as to shut down the power to protect the optical fiber 110.

The optical fiber protection system 110 of the present disclosure may be applied for a projection system. For example, the projection system includes isolated imaging system and the light source system, and the optical fiber 110 may connected with the imaging system and the light source system that are isolated with each other so as to transmit the light. However, the inner part of the melted optical fiber 110 may be broken due to high temperature or the outer shell of the melted optical fiber 110 may be penetrated such that the light may transmit out of the optical fiber 110. Therefore, by disposing the optical protection system 110 in the projection system, the life time of the projection system may be prolonged and the application flexibility of the projection system with the imaging system and the light source system that are isolated with each other may be increased.

In the present embodiment, the protection circuit 130 twines around the optical fiber 110 in spiral shape, but the present disclosure is not limited in this regard. In other embodiments, the protection circuit 130 may be disposed on the optical fiber 110 in parallel as long as the protection circuit 130 can be in contact with the optical fiber 110 and absorb the heat of the optical fiber 110 to form the open circuit. In the present embodiment, when the optical fiber 110 is bent, the protection circuit 130 twines around the optical fiber 110 can be bent easily along with the optical fiber 110, thereby reducing the possibility of broken of the protection circuit 130. In other words, by using the method of the present embodiment, the protection circuit 130 can be attached on the optical fiber 110 better.

In one embodiment, the sensor 140 is configured to sense an electrical resistance of the protection circuit 130. When the optical fiber 110 is partially overheated, the controller 150 may determine whether the power will be applied continuously or not based on the measured variation of the electrical resistance of the protection circuit 130 and the predetermined threshold of the electrical resistance.

Figure 2:
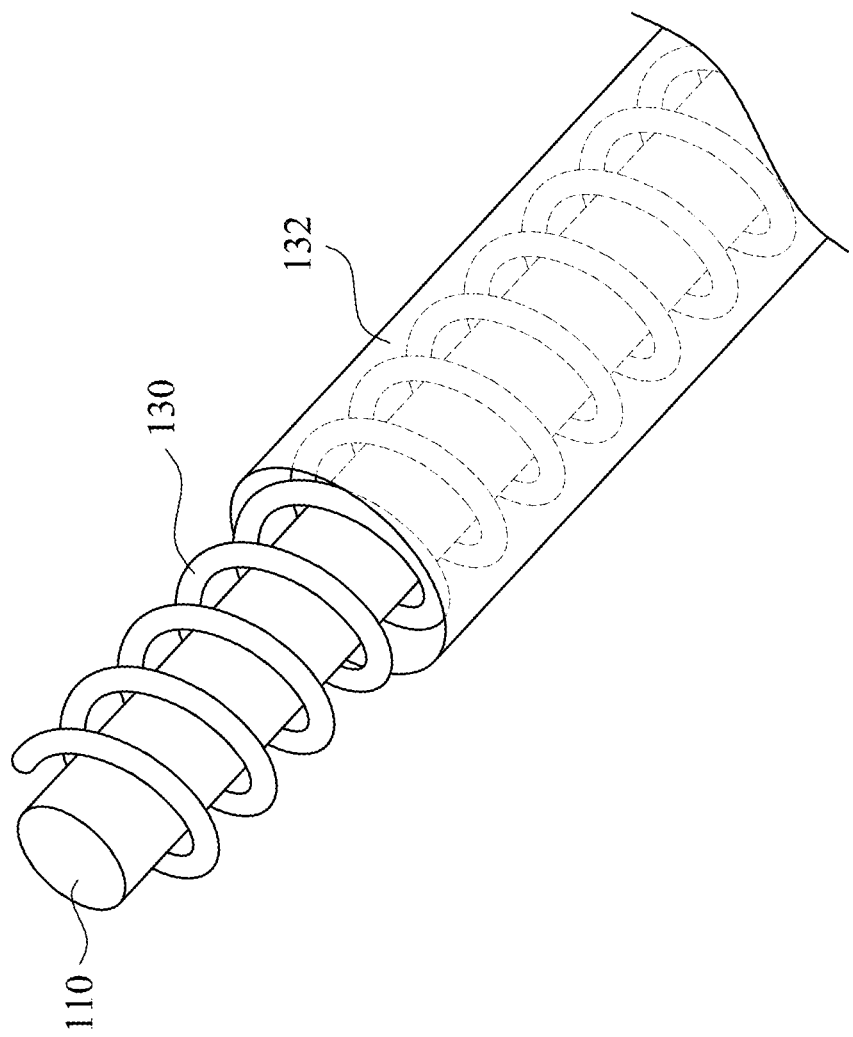
FIG. 2 is a schematic of an optical fiber protection system of another embodiment of the present disclosure.

FIG. 2 is a schematic of an optical fiber protection 200 system of another embodiment of the present disclosure. The light source 120, the sensor 140, and the controller 150 of the optical fiber protection 200 are omitted in FIG. 2. The optical fiber protection 200 is substantially the same as the optical fiber protection 100, and the difference is that the optical fiber protection 200 further includes a heat shrink tubing 132. The heat shrink tubing 132 at least partially surrounds the protection circuit 130 and the optical fiber 110. The protection circuit 130 is located between the heat shrink tubing 132 and the optical fiber 110. In one embodiment, a length of the heat shrink tubing 132 is smaller than a length of the optical fiber 110. That is, two sides of the optical fiber 110 protrude from the heat shrink tubing 132. In one embodiment, a portion of the protection circuit 130 is exposed form the heat shrink tubing 132. In other words, the length of the protection circuit 130 that is twined may be adjusted according to practical requirements. Similarly, the range of the heat shrink tubing 132 that is wrapped may be adjusted according to practical requirements.

Figure 3:
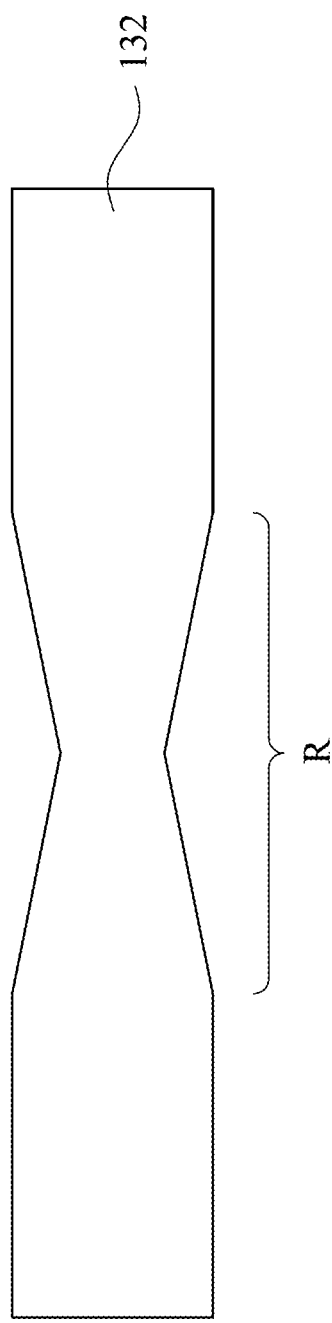
FIG. 3 is a schematic of the optical fiber protection system shown in FIG. 2, wherein the optical fiber protection system is overheated.

FIG. 3 is a schematic of the optical fiber protection system shown in FIG. 2, wherein the optical fiber protection system is overheated. In some embodiments, the material of the heat shrink tubing 132 may be Polyethylene (PE), and the shrink temperature of the heat shrink tubing 132 is of about 105 degrees to 115 degrees. In the present embodiment, a shrink temperature of the heat shrink tubing 132 is higher than a melting temperature of the low-temperature solder. As such, as shown in the region R shown in FIG. 3, the heat shrink tubing 132 may shrink to push the melted low-temperature solder due to high temperature when the optical fiber 110 is partially overheated such that the protection circuit 130 may form the open circuit and the insulating property at the melting position may be increased. Therefore, the precision of the optical fiber protection system 200 may be improved by using the low-temperature solder and the heat shrink tubing 132.

As described above, when the optical fiber 110 is partially overheated, the property of the low-temperature solder of the protection circuit 130 may be utilized to form an open circuit of the optical fiber protection system of the present disclosure, and the sensor 140 may sense that whether the protection circuit 130 is an open circuit. Subsequently, the controller 150 may transmit the signal to the light source 120 so as to shut down the power to protect the optical fiber 110. Or, the heat shrink tubing 132 may shrink to push the melted low-temperature solder due to high temperature such that the protection circuit 130 may form the open circuit and the insulating property at the melting position may be increased to improve the precision of the optical fiber protection system.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An optical fiber protection system, comprising:
an optical fiber;
a light source configured to transmit a signal to the optical fiber; and
a protection circuit extending along a length direction of the optical fiber;
a sensor electrically connected to the protection circuit, wherein the sensor is configured to determine whether the protection circuit is an open circuit; and
a controller electrically connected to the sensor and the light source.

2. The optical fiber protection system of claim 1, wherein the protection circuit twines around the optical fiber.

3. The optical fiber protection system of claim 1, wherein a material of the protection circuit includes a low-temperature solder.

4. The optical fiber protection system of claim 3, comprising:
a heat shrink tubing surrounding the low-temperature solder and the optical fiber, and the low-temperature solder being located between the heat shrink tubing and the optical fiber.

5. The optical fiber protection system of claim 4, wherein a shrink temperature of the heat shrink tubing is higher than a melting temperature of the low-temperature solder.

6. The optical fiber protection system of claim 4, wherein a length of the heat shrink tubing is smaller than a length of the optical fiber, and two sides of the optical fiber protrude from the heat shrink tubing.

7. The optical fiber protection system of claim 4, wherein a portion of the protection circuit is exposed from the heat shrink tubing.

8. The optical fiber protection system of claim 1, wherein the sensor is configured to sense an electrical resistance of the protection circuit.

9. The optical fiber protection system of claim 1, wherein the controller is configured to control the light source based on a sensing result of the sensor.

\* \* \* \* \*